United States Patent
Lin et al.

(10) Patent No.: US 9,301,405 B1
(45) Date of Patent: Mar. 29, 2016

(54) METHOD FOR MANUFACTURING MICROTHROUGH-HOLE IN CIRCUIT BOARD AND CIRCUIT BOARD STRUCTURE WITH MICROTHROUGH-HOLE

(71) Applicant: KINSUS INTERCONNECT TECHNOLOGY CORP., Taoyuan (TW)

(72) Inventors: Ting-Hao Lin, Taipei (TW); Yi-Fan Kao, New Taipei (TW); Jaen-Don Lan, New Taipei (TW); Yu-Te Lu, Taoyuan Hsien (TW); Yung-Lin Chia, Taoyuan County (TW); An-Ping Tseng, Taipei (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/604,956

(22) Filed: Jan. 26, 2015

(51) Int. Cl.
| | |
|---|---|
| *H01L 21/4763* | (2006.01) |
| *H05K 3/40* | (2006.01) |
| *H05K 3/06* | (2006.01) |
| *H05K 3/00* | (2006.01) |
| *H05K 3/18* | (2006.01) |
| *H05K 3/02* | (2006.01) |
| *H05K 1/09* | (2006.01) |
| *H05K 1/11* | (2006.01) |
| *H01L 21/48* | (2006.01) |

(52) U.S. Cl.
CPC .............. *H05K 3/4038* (2013.01); *H05K 1/09* (2013.01); *H05K 1/111* (2013.01); *H05K 1/115* (2013.01); *H05K 3/007* (2013.01); *H05K 3/0026* (2013.01); *H05K 3/022* (2013.01); *H05K 3/064* (2013.01); *H05K 3/188* (2013.01); *H01L 21/4857* (2013.01); *H01L 2924/014* (2013.01); *H01L 2924/01078* (2013.01); *H05K 2201/09509* (2013.01); *H05K 2201/09536* (2013.01)

(58) Field of Classification Search
CPC ............ H01L 21/4857; H01L 23/3218; H01L 23/49816; H01L 23/49827; H01L 23/49894; H01L 24/81; H01L 21/563; H01L 2924/01076; H01L 2924/014; H01L 2924/01079; H01L 2924/01033; H01L 2224/13111; H01L 2224/16; H05K 3/4352; H05K 2203/0315; H05K 2201/2081; H05K 2201/10674
USPC .......... 438/637, 629, 662, 667, 687; 257/774, 257/758, 762
See application file for complete search history.

(56) References Cited

U.S. PATENT DOCUMENTS 6,410,858 B1 * 6/2002 Sasaki ............... H01L 23/49822
174/200

* cited by examiner

*Primary Examiner* — Thinh T Nguyen
(74) *Attorney, Agent, or Firm* — Lin & Associates Intellectual Property, Inc.

(57) ABSTRACT

A method for manufacturing microthrough-hole includes electroplating a metal layer on a carrier plate, patterning the metal layer to form a first circuit having copper pads, covering the first circuit with a photoresist layer and not covering the copper window between two of the copper pads, etching the metal layer beneath the copper window and removing the photoresist layer, sequentially forming an insulation layer and a second circuit on the first circuit and the copper window, the second circuit layer having a stop pad corresponding to the copper window, removing the carrier plate, upward drilling through the insulation layer between the stop pad and the copper window to form a microthrough-hole beneath the stop pad, and forming a conductive layer in the microthrough-hole to form the microthrough-hole connecting the first and second circuits. The microthrough-hole and its occupied area is greatly reduced, thereby achieving high circuit density.

7 Claims, 9 Drawing Sheets

METHOD FOR MANUFACTURING MICROTHROUGH-HOLE IN CIRCUIT BOARD AND CIRCUIT BOARD STRUCTURE WITH MICROTHROUGH-HOLE

BACKGROUND OF THE INVENTION

1. Field of the Invention

The present invention relates generally to a method for manufacturing microthrough-hole and a circuit board structure with microthrough-hole, and more specifically to a method for manufacturing microthrough-hole in a circuit board by using the pitch of the buried metal circuit as the diameter of the microthrough-hole, and employing the aspect that a laser beam easily penetrates insulation material but difficultly through metal material so as to effectively shrink the microthrough-hole, reduce its occupied area and achieve the demand of high circuit density.

2. The Prior Arts

In general, printed circuit boards (PCBs) are necessary for all electronic products to mount various electronic elements.

The PCBs are commonly categorized as single board, double boards and multiple boards. Recently, electronic gadgets have become much smaller, lighter, thinner, faster, and required more excellent performance, higher circuit density and lower cost. In particular, the present package technologies have a trend of high pin count, fine pitch and packed integration. As a result, it is very changing for the PCBs to implement the features of high density circuit layout, miniaturized holes, composite multiple layers and ultra thin plate. The processes of building up multiple layers and high density interconnection (HDI) are two widely used schemes for the multiple layer PCBs.

Please refer to FIGS. 1A-1D showing the interlayer connection structure in the prior arts. As shown in FIG. 1A, the first circuit 7a is formed on the first stack plate 1a. Next, the insulation layer 3a is formed on the first stack plate 1a and the first circuit 7a, and the second circuit 11a is formed on the insulation layer 3a (FIG. 1B). The pattern of copper window 9a is formed by etching the second circuit 11a through a process of manufacturing copper window (FIG. 1C). A laser beam is employed to drill through the insulation layer 3a at the copper window 9a to form the through-hole 14a on the first circuit 7a as the stop pad (FIG. 1D).

Traditional microvia is primarily manufactured by the laser drilling process such as conformal mask drilling, enlarge window drilling and copper direct drilling. Further refer to FIG. 1D showing the process of opening copper window in the prior arts. The insulation layer 3a, the second circuit 11a and the first circuit 7a are sequentially formed on the first stack plate 1a. Then, part of the second circuit 11a is etched to form the opening (copper window 9a), and the opening is processed by the laser 16a to form the through-hole 14a on the insulation layer 3a.

However, the diameter of the through-hole manufactured by the process of copper window is limited by the size of the laser beam passing through the mask, and particularly the processes of photoresist development and photolithography. As a result, the size of the window for the through-hole can not be further reduced and the circuit density of the circuit board is hard to increase.

Specifically, since it is difficult for the copper foil to absorb the laser, the process of photoresist development needs the help of the photolithography to form the opening in the second circuit 11a. Based on the current technology, the window formed on the patterned photoresist layer has a minimum size larger than 50 μm. Thus, the opening formed by etching the second circuit 11a is surely larger than 50 μm.

If the copper window is further widened in the copper window process, the usage of the available circuit area of the second circuit 11a is reduced. While the process of direct laser may omit the process of forming the copper window, the absorption of the laser beam needs to increase and the size of the opening is still limited by the beam size through the mask.

In addition, the process of desmear performed after laser drilling greatly widens the opening size such that the pitch in the final product is only 140 μm.

Therefore, it is greatly needed for the method for manufacturing microthrough-hole, in which the first circuit and the copper window are first formed, only the metal material is treated to improve stability of the process, the process of patterned dry film electroplating is used to form the metal circuit having line width and pitch less than 50 μm, the metal circuit is buried in the insulation layer, only the insulation layer is penetrated during the laser drilling, and the size of the microthrough-hole is the same as the size of the copper window so as to achieve the object of high circuit density, thereby overcoming the above problems in the prior arts.

SUMMARY OF THE INVENTION

The primary objective of the present invention is to provide a method for manufacturing microthrough-hole in a circuit board comprising the steps of preparing a carrier plate, electroplating a metal layer on the carrier plate, forming a first circuit having copper pads on one surface of the metal layer, covering the first circuit with a photoresist layer and not covering the copper window between two of the copper pads, etching the metal layer beneath the copper window until the carrier plate is exposed, removing the photoresist layer, sequentially forming an insulation layer and a second circuit on the first circuit and the copper windows, the second circuit layer having a stop pad corresponding to the copper window, removing the carrier plate, employing a drilling process to upward drill through the insulation layer corresponding to the copper window and stop at the stop pad to form a microthrough-hole beneath the stop pad, and forming a conductive layer in the microthrough-hole to electrically connect the first and the second circuits so as to form the microthrough-hole. The microthrough-hole of the present invention is effectively shrunk and its occupied area is greatly reduced, thereby achieving the requirement of high circuit density.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1A:
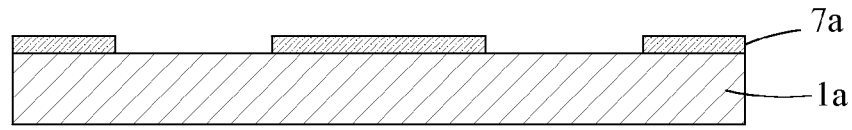
FIGS. 1A-1D show an interlayer connection structure in the prior arts.
Figure 1B:
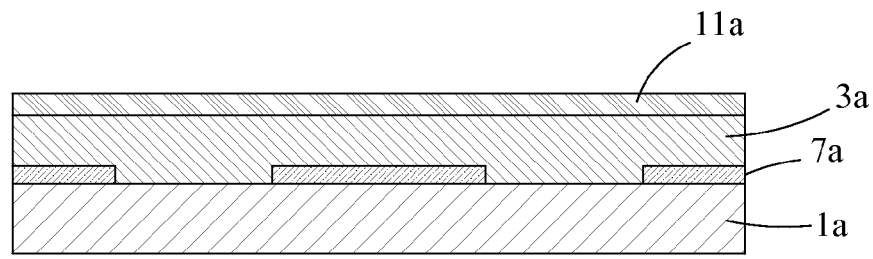
Figure 1C:
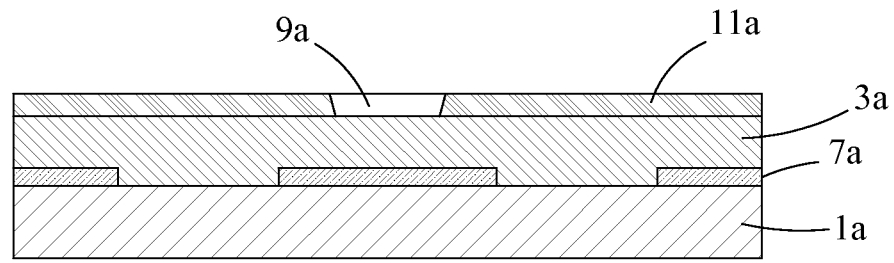
Figure 1D:
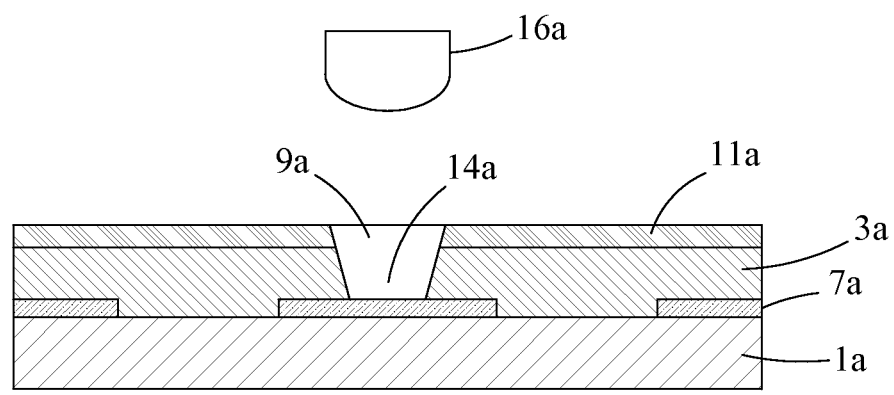
Figure 2:
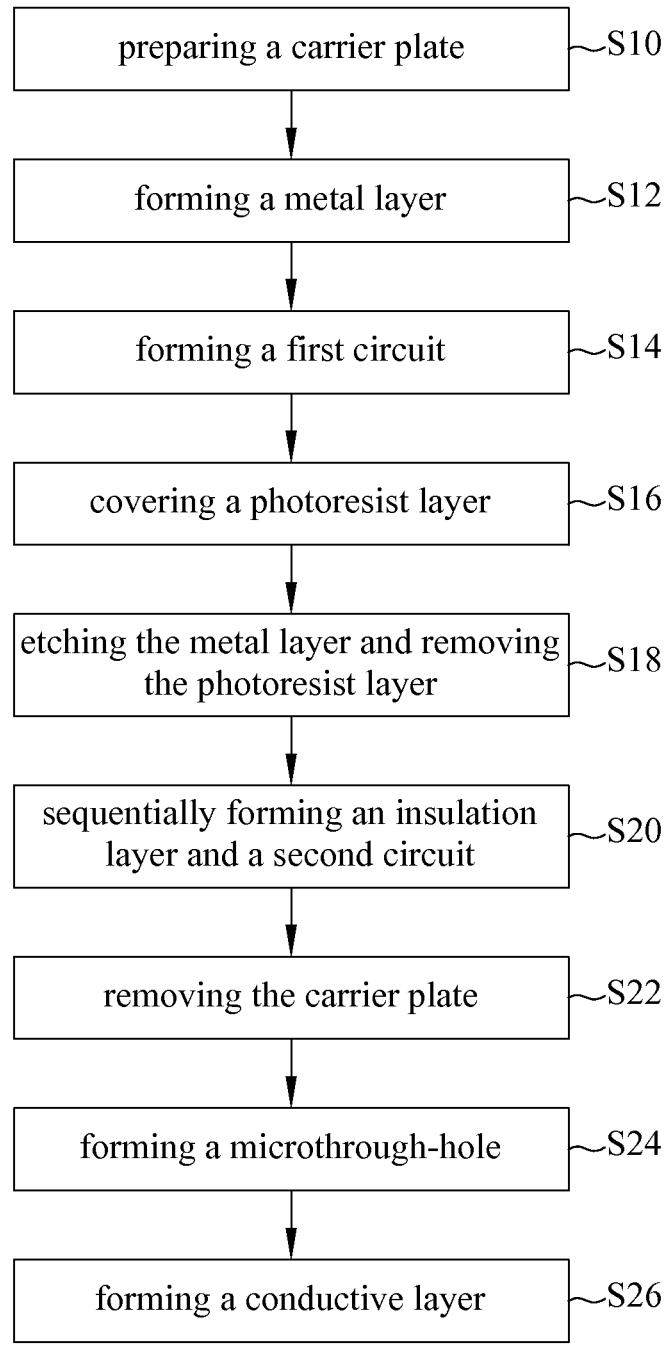
FIG. 2 is a flowchart showing the steps of the method for manufacturing microthrough-hole according to the present invention.
Figure 3A:
FIGS. 3A-3I are sectional views showing the sequential steps of the method for manufacturing microthrough-hole according to the present invention.
Figure 3B:
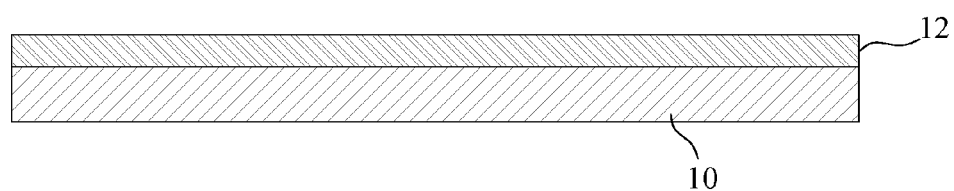

Please refer to FIG. 2 showing the flowchart of the method for manufacturing microthrough-holes according to the present invention. Also, refer to FIGS. 3A to 3I illustrating the sectional views of the sequential processing steps for the method of the present invention. As shown in FIG. 2, the method for manufacturing microthrough-hole of the present invention generally comprises the processing steps S10, S12, S14, S16, S18, S20, S22, S24 and S26. First, the step S10 is performed by providing a carrier plate 10 (FIG. 3A), and a metal layer 12 is electroplated on the carrier plate 10 in step S12 (FIG. 3B). The metal layer 12 is preferably formed of copper (Cu) or other suitable metal material.

Figure 3C:
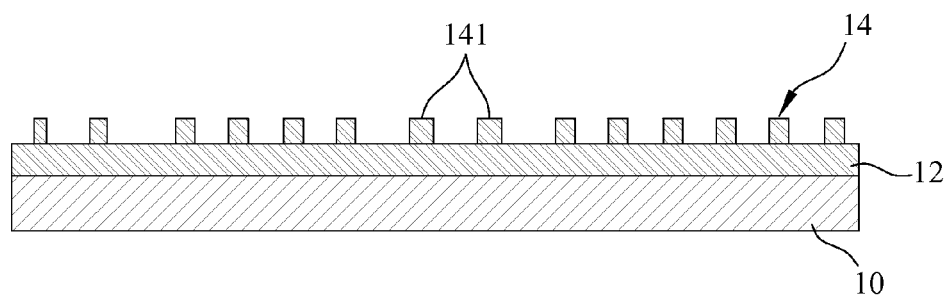

In the step S14, one surface of the metal layer 12 is patterned to form the first circuit 14, comprising a plurality of copper pads 141 (FIG. 3C). It is preferred that the first circuit 14 is formed by the process of patterned dry film electroplating or other suitable scheme.

Figure 3D:
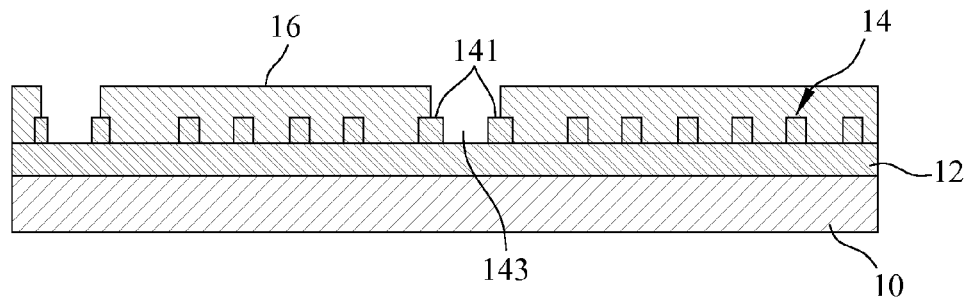

The step S16 is performed by covering the first circuit 14 with a photoresist layer 16 (FIG. 3D). Particularly, a copper window 143 between two of the copper pads 141 is not covered. The photoresist layer 16 is formed of a dry film photoresist or a wet film photoresist.

Figure 3E:
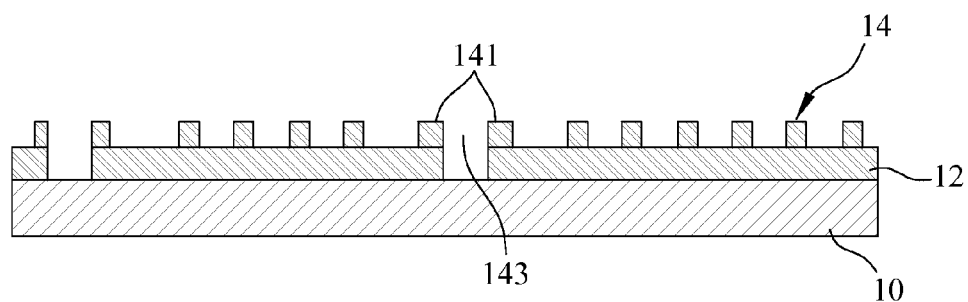

Then, the metal layer 12 beneath the copper window 143 is etched until the carrier plate 10 is exposed and the photoresist layer 16 is removed in the step S18 (FIG. 3E).

Figure 3F:
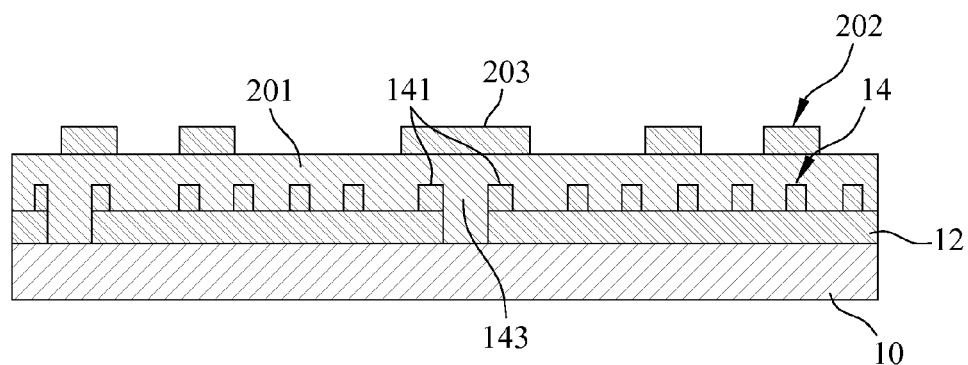
Figure 3G:
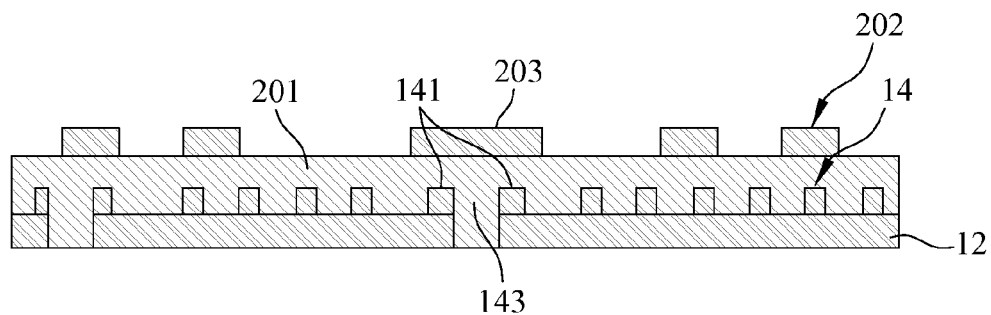

In the step S20, the insulation layer 201 and the second circuit 202 are sequentially formed on the first circuit 14 and the copper window 143 and the second circuit 202 is patterned and has a stop pad 203 corresponding to the copper window 143 (FIG. 3F).

Figure 3H:
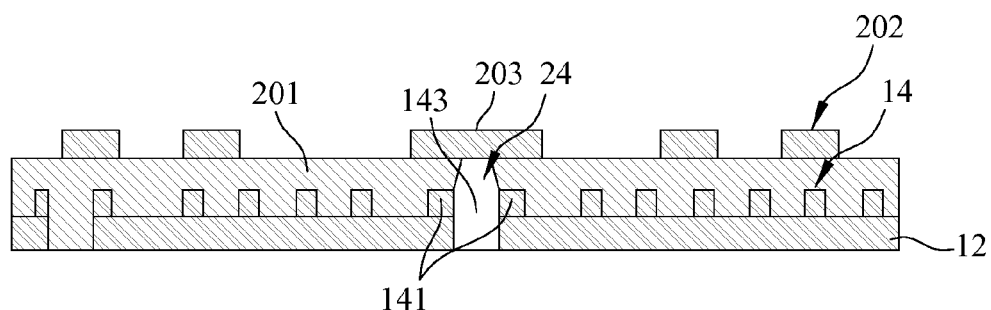

In the step S22, the carrier plate 10 is removed (FIG. 3G), and then the step S24 is performed by employing a drilling process to upward drill through the insulation layer 201 corresponding to the copper window 143 to stop at the stop pad 203 so as to form a microthrough-hole 24 beneath the stop pad 203 (FIG. 3H). Preferably, the microthrough-hole 24 is a blind hole or a buried hole.

Additionally, the above drilling process is a laser drilling process, which employs a mask to define a size of a laser beam, and the size of the microthrough-hole 24 is specified by the size of the copper window 143.

Figure 3I:
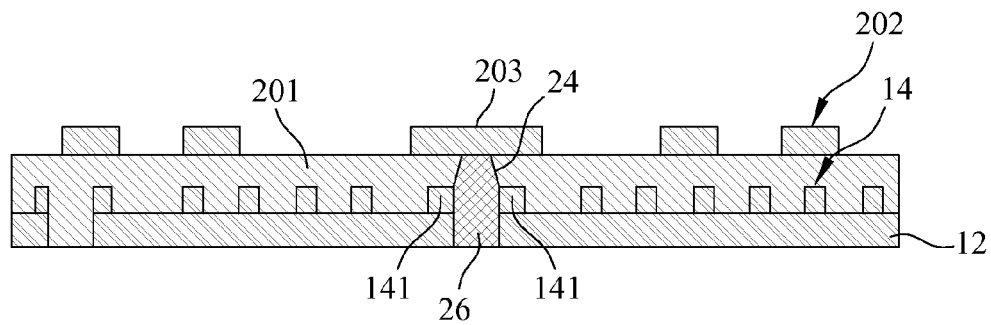

Finally, a conductive layer 26 is formed in the microthrough-hole 24 to electrically connect the first circuit 14 and the second circuit 202 in the step S26 (FIG. 3I). Specifically, the conductive layer 26 is formed of a metal layer.

Figure 4:
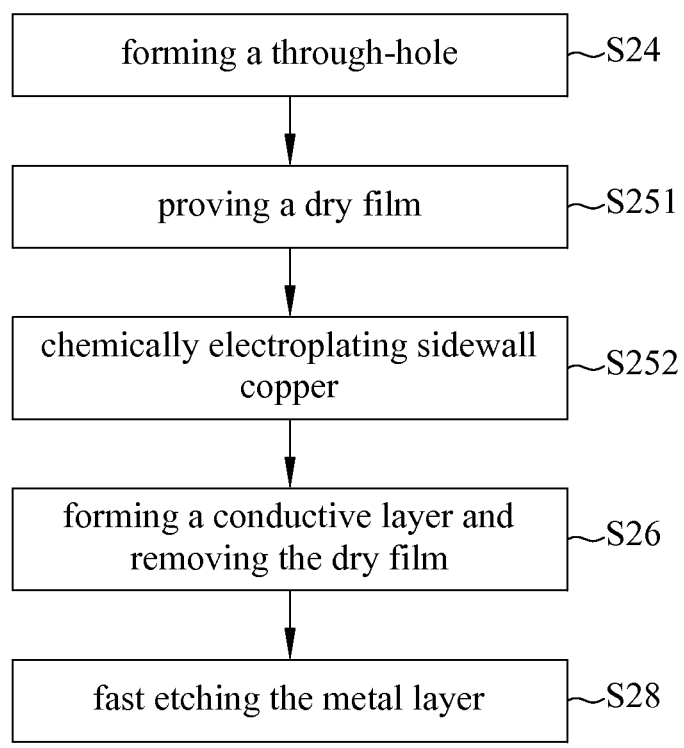
FIG. 4 is a flowchart showing the steps of manufacturing the conductive layer according to the present invention.
Figure 5:
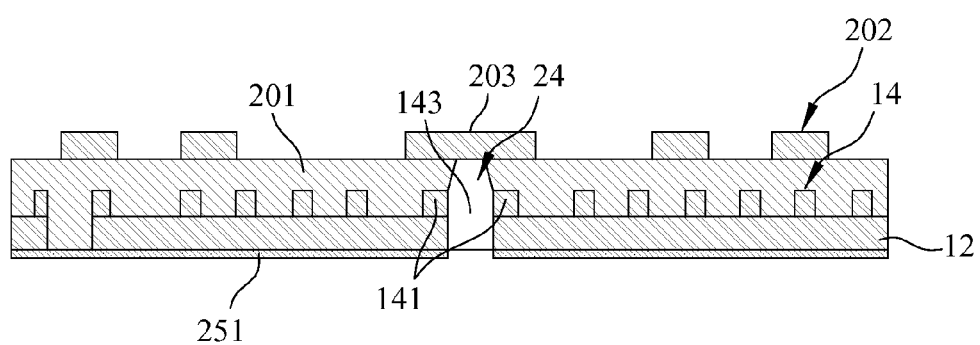
FIG. 5 is a view showing the step of providing the dry film for forming the conductive layer according to the present invention.

Further refer to FIG. 4 showing the flowchart for the steps of manufacturing the conductive layer according to the present invention. As shown in FIG. 4, the Steps S251 and S252 are included between the steps S24 and S26. In other words, after the step S24, the step S251 is performed by providing the dry film 251 on another surface of the metal layer 12, wherein the microthrough-hole 24 is exposed, as shown in FIG. 5.

Figure 6:
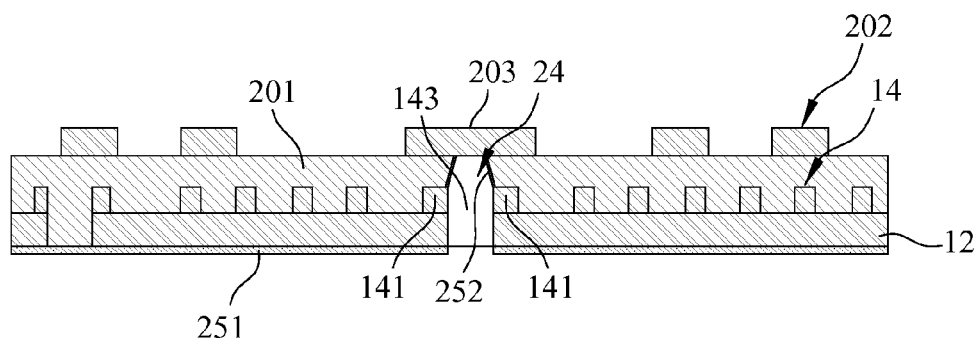
FIG. 6 is a view showing the copper layer provided for forming the conductive layer according to the present invention.
Figure 7:
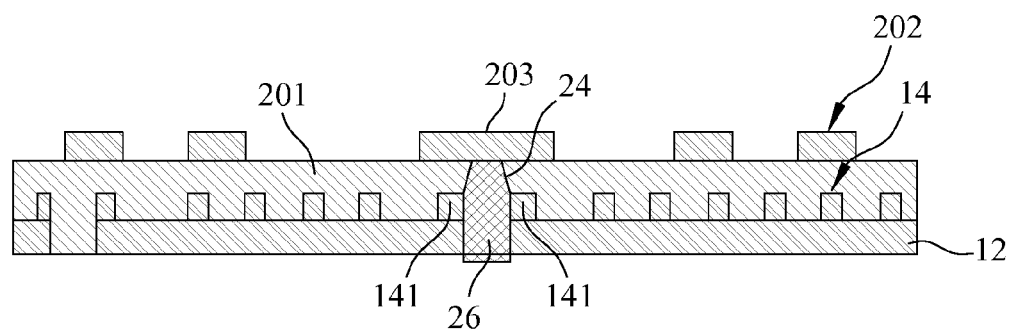
FIG. 7 is a view showing the step of removing the dry film for forming the conductive layer according to the present invention.
Figure 8:
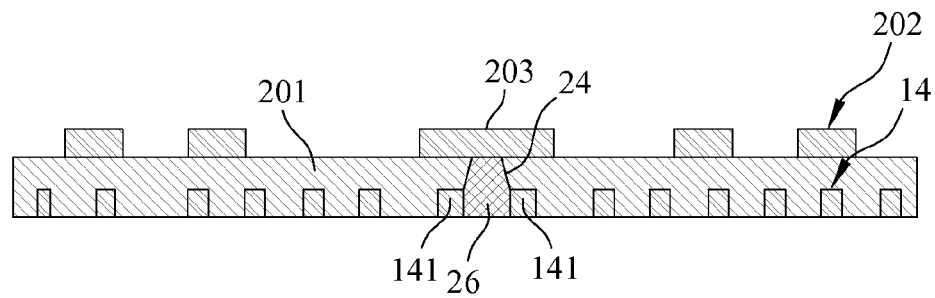
FIG. 8 is a view showing the etching step for forming the conductive layer according to the present invention.

Subsequently, in the step S252, a copper layer 252 is chemically electroplated on the sidewall of the microthrough-hole 24, as shown in FIG. 6. The step S26 is then performed by forming the conductive layer 26 by means of electrically electroplating and removing the dry film 251, as shown in FIG. 7. In the step S28, part of the metal layer 12 is etched until the first circuit 14 is exposed, as shown in FIG. 8.

Another embodiment of the present invention is to provide a circuit board structure with microthrough-hole, as shown in FIG. 7. More specifically, the circuit board structure with microthrough-hole is manufactured after the above processes, and particularly, the circuit board structure of the present invention comprises the insulation layer 201, the first circuit 14 buried in the insulation layer 210 and having a plurality of copper pads, and the second circuit 202 formed out of the insulation layer 201. The first circuit 14 is provided with the copper pads 141, and the copper window 143 is provided between two of the copper pads 141, as shown in FIGS. 5 and 6. The second circuit 202 has the stop pad 203 corresponding to the copper window 143, and the microthrough-hole 24 is provided between the copper window 143 and the stop pad 203. The conductive layer 26 is formed in the microthrough-hole 24 so as to electrically connect the first circuit 14 and the second circuit 202.

From the above mention, one primary feature of the present invention is that the steps S10-S18 are employed to form the first circuit and define the copper window by means of patterned dry film electroplating, and the step S20 is to form buried circuit in the first circuit and the copper window such that the insulation layer is exposed and provided between two copper pads. Since copper is hard to absorb the laser beam, when the laser beam is incident onto the two copper pads and the insulation layer, only the insulation layer allows the laser beam to penetrate so as to form the microthrough-hole. Thus, the microthrough-hole has the size as the copper window in the first circuit, and is not limited by the laser beam size through the mask.

Furthermore, the first circuit of the present invention is a buried circuit and the microthrough-hole is not covered with the metal layer when the microthrough-hole is formed in the insulation layer. Thus, the laser beam can directly penetrate the insulation layer to form the microthrough-hole. However, the insulation layer is covered with the metal layer in the prior arts, and since the laser beam is hard to penetrate the metal layer, the copper window is first formed on the metal layer by means of image transfer, and the insulation layer is then drilled by laser to form the microthrough-hole. Particularly, after the laser drilling process, the process of desmear is needed to perform such that the microthrough-hole is widened. In general, the minimum pitch of the final product is only 140 µm.

In contrast, the metal layer is treated by the process of patterned dry film electroplating to form the first circuit and the copper window. For the current manufacturing technology, the line width and the pitch of the first circuit can be easily controlled less than 50 µm. Additionally, during the formation of the first circuit and the copper window, only the metal layer and the carrier plate, which are made of metal material, are treated, and the processing parameters are easy to adjust, thereby precisely controlling the line width and the pitch of the first circuit.

Since the copper window formed in the first circuit by patterned dry film electroplating is easily controlled less than 50 μm, after the insulation layer between the first circuit and the second circuit is laser drilled, the microthrough-hole manufactured has a diameter greatly shrunk to less than 50 μm so as to increase circuit density.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing microthrough-hole in circuit board, comprising:
   preparing a carrier plate;
   electroplating a metal layer on the carrier plate;
   forming a first circuit with a plurality of copper pads on one surface of the metal layer;
   covering the first circuit with a photoresist layer, wherein a copper window between two of the copper pads is not covered;
   etching the metal layer beneath the copper window until the carrier plate is exposed and removing the photoresist layer;
   sequentially forming an insulation layer and a second circuit on the first circuit and the copper windows, the second circuit layer having a stop pad corresponding to the copper window;
   removing the carrier plate;
   employing a drilling process to upward drill through the insulation layer corresponding to the copper window and stop at the stop pad so as to form a microthrough-hole beneath the stop pad; and
   forming a conductive layer in the microthrough-hole to electrically connect the first circuit and the second circuit.

2. The method as claimed in claim 1, wherein the first circuit is formed by a process of patterned dry film electroplating.

3. The method as claimed in claim 1, wherein the drilling process is a laser drilling process, employing a mask to define a size of a laser beam, and a size of the microthrough-hole is specified by a size of the copper window.

4. The method as claimed in claim 1, wherein the microthrough-hole is a blind hole or a buried hole.

5. The method as claimed in claim 1, wherein the photoresist layer is formed of a dry film photoresist or a wet film photoresist.

6. The method as claimed in claim 1, wherein the conductive layer is implemented by a metal layer.

7. The method as claimed in claim 1, wherein after the microthrough-hole is formed, another surface of the metal layer is provided with a dry film exposing the microthrough-hole, a copper layer is then chemically electroplated on a sidewall of the microthrough-hole, the conductive layer is formed by electrically electroplating, the dry film is removed, and part of the metal layer is etched until the first circuit is exposed.

* * * * *